United States Patent
Nakayama et al.

(10) Patent No.: US 8,728,615 B2
(45) Date of Patent: May 20, 2014

(54) TRANSPARENT CONDUCTIVE FILM AND METHOD OF FABRICATING THE SAME, TRANSPARENT CONDUCTIVE BASE MATERIAL, AND LIGHT-EMITTING DEVICE

(75) Inventors: Tokuyuki Nakayama, Ichikawa (JP); Yoshiyuki Abe, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 10/593,287

(22) PCT Filed: Sep. 13, 2005

(86) PCT No.: PCT/JP2005/016808
§ 371 (c)(1),
(2), (4) Date: Sep. 18, 2006

(87) PCT Pub. No.: WO2006/030762
PCT Pub. Date: Mar. 23, 2006

(65) Prior Publication Data
US 2008/0038529 A1    Feb. 14, 2008

(30) Foreign Application Priority Data

Sep. 13, 2004  (JP) .................................. 2004-265528
Aug. 31, 2005  (JP) .................................. 2005-252788

(51) Int. Cl.
  *B32B 27/32*     (2006.01)
  *H05K 1/11*      (2006.01)
  *H01B 1/02*      (2006.01)

(52) U.S. Cl.
  USPC ........... 428/220; 428/221; 428/697; 428/702; 174/261; 252/518.1

(58) Field of Classification Search
  USPC ............... 430/530, 63, 527, 496, 41; 428/220
  See application file for complete search history.

(56) References Cited

U.S. PATENT DOCUMENTS 7,476,343 B2    1/2009  Nakayama et al.
7,563,514 B2 *  7/2009  Nakayama et al. ........... 428/432
(Continued)

FOREIGN PATENT DOCUMENTS

CN    1112878     2/1995
JP    09-259640   10/1997
(Continued)

OTHER PUBLICATIONS

Machine translation of JP 2000-106034.*
(Continued)

*Primary Examiner* — Ellen S. Raudenbush
*Assistant Examiner* — Anthony J Frost
(74) *Attorney, Agent, or Firm* — Smith, Gambrell & Russell, LLP (57) ABSTRACT

A new transparent conductive laminated thin film is provided which not only has a high transmittance of light in the visible region and a low surface resistance (6-500Ω/□), but also combines high transmittances of light in the visible region of short wavelengths of 380-400 nm and the near-ultraviolet region of shorter wavelengths of 300-380 nm. The transparent conductive film has a lamination structure that the surfaces of the metallic thin film 11 are coated with the transparent oxide thin films 10 and 12. Each of the transparent oxide thin film 10 and 12 is an amorphous oxide thin film chiefly composed of gallium, indium, and oxygen or composed of gallium and oxygen, and the gallium content of each transparent oxide thin film ranges from 35 at. % to 100 at. % with respect to all metallic atoms.

15 Claims, 3 Drawing Sheets

(56) References Cited

U.S. PATENT DOCUMENTS

| | | |
|---|---|---|
| 2006/0152136 A1 * | 7/2006 | Fujikake et al. ............. 313/503 |
| 2007/0051926 A1 | 3/2007 | Nakayama |
| 2007/0184286 A1 | 8/2007 | Nakayama |
| 2007/0200100 A1 | 8/2007 | Nakayama |
| 2008/0032106 A1 | 2/2008 | Nakayama |

FOREIGN PATENT DOCUMENTS

| | | | |
|---|---|---|---|
| JP | 09-291356 | 11/1997 | |
| JP | 09-318933 | 12/1997 | |
| JP | 10-190030 | 7/1998 | |
| JP | 11-262968 | 9/1999 | |
| JP | 2000-044236 | 2/2000 | |
| JP | 2000044236 A * | 2/2000 | ............. C01G 15/00 |
| JP | 2000-106034 | 4/2000 | |
| JP | 2002-012964 | 1/2002 | |
| JP | 2004-127719 | 4/2004 | |
| JP | 2004-139928 | 5/2004 | |
| WO | 2004/035302 A2 | 4/2004 | |
| WO | WO 2005083722 A1 * | 9/2005 | ............... H01B 5/14 |

OTHER PUBLICATIONS

Machine translation of JP 09-259640.*
Machine translation of JP 09-291356.*
Human translation of JP2000-106034.*
Human translatoin of JP 09-259640.*
Minami et al. "New Multicomponent Transparent Conducting Oxide Films for Transparent Electrods of Flat Panel Displays" Jan. 22, 1996; J. Vac. Sci. Technol. A 14(3). 1689-1693.*
STIC search for Ga/In oxide conductive films with atomic ratio of greater than 50% less than 100%. Sep. 3, 2009.*
International Seach Report for PCT/JP2005/016808.
U.S. Appl. No. 12/314,238, Nakayama et al., "Sintered Body Target for Transparent Conductive Film Fabrication, Transparent Conductive Film Fabricated by Using the Same, and Transparent Conductive Base Material Comprising the Conductive Film Formed Thereon", filed Dec. 5, 2008.

* cited by examiner

FIG.10

TRANSPARENT CONDUCTIVE FILM AND METHOD OF FABRICATING THE SAME, TRANSPARENT CONDUCTIVE BASE MATERIAL, AND LIGHT-EMITTING DEVICE

CROSS REFERENCE TO RELATED APPLICATION

The present application is a 371U.S. National Stage of PCT/JP2005/016808, filed 13 Sep. 2005, which claims priority from JP 2004-265528, filed 13 Sep. 2004, which claims priority from JP 2005-252788, filed 31 Aug. 2005, the contents of which are incorporated in their entirety herein by reference.

TECHNICAL FIELD

This invention relates to a transparent conductive film used as a transparent electrode of a luminescent material or a light-emitting device that has the function of blue light emission or near-ultraviolet emission; of a transparent conductive film material that has a high transmittance in the range from a near-ultraviolet region to a visible region and a low resistance, useful for the transparent electrode of a solar cell converting solar radiation into electric power, notably a widespread display device such as a next-generation liquid crystal display (LCD) element in which blue light emission is greatly considered or an organic or inorganic electroluminescence (EL) element, or; of a blue or near-ultraviolet light-emitting diode (LED) element, and to a transparent conductive base material and a light-emitting device, each using the transparent conductive film.

BACKGROUND ART

The transparent conductive films have a high conductivity (for example, a resistivity of $1 \times 10^{-3}$ $\Omega$cm or less) and a high transmittance in the visible region and thus are utilized as the electrodes of solar cells, liquid crystal display elements, and other various light-receiving elements, followed by heat wave reflective films used for window glass of cars and buildings, various antistatic films, and antifogging transparent heating elements for refrigerating show cases.

For the transparent conductive films, antimony- or fluorine-doped tin oxide ($SnO_2$) films, aluminum- or gallium-doped zinc oxide (ZnO) films, and tin-doped indium oxide ($In_2O_3$) films are widely utilized. In particular, the tin-doped indium oxide films, namely $In_2O_3$-Sn based films, are referred to as ITO (indium tin oxide) films and are most main current materials widely used in various devices, not to speak of LCDs, because low-resistance transparent conductive films are easily available. When the ITO film is deposited on the substrate by a sputtering process at room temperature, a conductive film with a thickness of 200 nm and a surface resistance of about 25$\Omega$/□ (about $5 \times 10^{-4}$ $\Omega$cm in terms of a resistivity) is obtained.

On the other hand, a transparent conductive film different from a simple ITO film, namely a transparent conductive film formed by the lamination of transparent oxide thin films and a metallic thin film is proposed. In Patent Reference 1 described below, for example, a transparent conductive film having a three-layer structure that a silver-based alloy thin film of 5-20 nm in thickness is sandwiched between transparent oxide thin films is disclosed and has the feature that each of the transparent oxide thin films is an oxide mixing a first base material containing at least one kind of oxide of a metal that is easy to dissolve with silver and a second base material containing at least one kind of oxide of a metal that is hard to dissolve with silver and the silver-based alloy thin film is a silver alloy containing gold at a minimum. It is further disclosed that the first base material included in the transparent oxide thin film is indium and the second base material is cerium (an In—Ce—O film, which is sometimes described as an ICO film).

Generally, the surface resistance of the ITO film with a thickness in the order of 100 nm, deposited at room temperature, is nearly 50$\Omega$/□. In contrast to this, the surface resistance of the above laminated film with a thickness of 50-100 nm can be reduced to 10$\Omega$/□ or less, depending on the thickness of the silver-based alloy thin film, and to 5$\Omega$/□ or less, when occasion demands.

Recently, luminescent materials and light-emitting devices (for example, LEDs, lasers, and organic or inorganic EL elements) having the functions of blue light emission and near-ultraviolet emission (for example, with wavelengths of 300-400 nm) and solar cells converting solar radiation into electric power have been widely popularized. (For near-ultraviolet LEDs, refer to Non-Patent References 1 and 2 described below.) The transparent electrodes are also indispensable for these electronic devices.

Patent Reference 1: Japanese Patent Kokai No. Hei 9-176837
Patent Reference 2: Japanese Patent Kokai No. Hei 7-182924
Patent Reference 3: Japanese Patent Kokai No. Hei 9-259640
Non-Patent Reference 1: Appl. Phys., Vol. 68 (1999), No. 2, pp. 152-155
Non-Patent Reference 2: SEI Technical Review, September 2004 (No. 165), pp. 75-78

DISCLOSURE OF THE INVENTION

Problems that the Invention is to Solve

In the light-emitting devices and solar cells in which visible light in the 400-800 nm wavelength region has been greatly considered so far, ITO, ZnO based, and $SnO_2$ based materials have been used for transparent electrodes. However, these conventional materials, although excellent in transmittance of light in the visible region of 400-800 nm, absorb blue light of nearly 380 nm and near-ultraviolet light of shorter wavelengths and thus cannot completely transmit such light.

Even in the case of the ICO film mentioned above, there is the disadvantage that the transmittance of light is reduced due to absorption in the short-wavelength region of the visible light (in the visible region of short wavelengths) of about 380-400 and the near-ultraviolet region of shorter wavelengths (for example, of 300-380 nm).

Even in low-resistance transparent conductive films obtained by the three-layer structure that the silver-based thin film is laminated with the ITO films and by the three-layer structure that the silver-based thin film is sandwiched between the ITO films such as those shown in Patent Reference 1, it is the same that the transmittance of light of wavelength 400 nm or less is low.

As such, these conventional materials cannot be used for the transparent electrodes of the luminescent materials and light-emitting devices having the functions of blue light emission and near-ultraviolet emission and the solar cells converting solar radiation into electric power. In particular, when the film thickness of the transparent electrode is increased, the luminous efficiency of the light-emitting device is seriously impaired. Moreover, near-ultraviolet light in solar radiation cannot be brought into the solar cell. In the case where the transparent electrode is used as an electrode for a self-luminous type element such as the organic EL element or for liquid crystal drive of a color electronic paper utilizing natural light without back light, it is undesirable that the conventional materials are used for transparent electrodes, because the taking-out efficiency of light in the visible region of short wavelengths is substantially decreased. Even when it is used as the electrode of a device utilizing a blue or near-ultraviolet LED or a laser, the use of the conventional materials is undesirable because the transmittance of light in the visible region of short wavelengths and the near-ultraviolet region of shorter wavelengths to be used is impaired.

It is thus expected to develop the transparent conductive film having a lamination structure that not only is the surface resistance low, but also a high transmittance is brought about in the visible region of short wavelengths and the near-ultraviolet region.

Patent Reference 2 states that, in a gallium-indium oxide ($GaInO_3$) film in which a hetrovalent dopant like a quadrivalent atom is doped by a small amount, transparency is promoted, index matching is improved, and the electrical conductivity of nearly the same level as in a wide-band-gap semiconductor used at present can be attained.

Patent Reference 3 proposes a transparent conductive film in which, in a quasi-two-dimensional system indicated by $Ga_2O_3$—$In_2O_3$ as the transparent conductive film having a composition range considerably different from $GaInO_3$ which has been known in the past and possessing much higher conductivity than $GaInO_3$ and $In_2O_3$, namely lower resistivity and excellent optical properties, a Ga content indicated by Ga/(Ga+In) is 15-49 at. %. This thin film is a microcrystalline film including amorphism, $GaInO_3$, or a mixed phase of $GaInO_3$ and $In_2O_3$, or $GaInO_3$ and $Ga_2O_3$, and allows carrier production of a high level by the introduction of an intrinsic donor due to an intrinsic lattice defect of an oxygen hole or an interstitial atom or of an extrinsic donor in which a part of a group III element is displaced by a group IV element and a part of a group VI element is displaced by a group VII element. As a result, a low resistivity that is not obtained in $GaInO_3$ and $In_2O_3$ can be attained.

However, such a film is fundamentally a crystalline thin film and must be deposited at a high temperature in order to obtain sufficient properties. In this film, therefore, a common resin film formed of polyethylene terephthalate (PET) or polycarbonate (PC) cannot be used as the substrate and there is a problem that its application is limited. Furthermore, another problem arises that other parts constituting the device are affected by heat in the fabrication process.

On the other hand, the present inventors, in Japanese Patent Application No. 2004-54816, propose an amorphous transparent conductive film which is composed of Ga, In, and O, contains 35 at. % to 45 at. % Ga with respect to all metallic atoms, and has the advantages of exhibiting a high transmittance in the visible region of short wavelengths. Since the amorphous transparent conductive film can be deposited at room temperature, the restriction of the substrate due to heat and the influence of heat in the fabrication process can be eliminated, which is extremely advantageous to industry. However, to use the amorphous transparent conductive film as the transparent electrode of the display device, its conductivity is not yet satisfied. When the Ga content of the amorphous transparent conductive film is beyond the upper limit, namely when the Ga content is beyond 45 at. % with respect to all metallic atoms, a high transmittance is obtained in the visible region of shorter wavelengths. The amorphous transparent conductive film, on the other hand, has the problem that the conductivity is reduced. It is thus expected to improve the conductivity of the amorphous transparent conductive film which, by utilizing the feature that the high transmittance is retained in the visible region of short wavelengths, can be used as the transparent electrode not only of the organic EL element or the LED element, but also of the luminescent material or the light-emitting device having the functions of blue light emission and near-ultraviolet emission or of the solar cell converting solar radiation into electric power.

The present invention is made to solve the above problems, and it is an object of the present invention to provide a novel transparent conductive laminated thin film in which the transmittance in visible region is high, a low surface resistance (6-500Ω/□) is retained, and high transmittances are combined in the visible region of short wavelengths between 380 and 400 nm and the near-ultraviolet region of shorter wavelengths between 300 and 380 nm.

Means for Solving Problems

In order to achieve the above object, the inventors devote attention to the transparent conductive film having a lamination structure that the surface of a metallic thin film is coated with a transparent oxide thin film, and have found that the problems can be solved in the transparent conductive film in which the transparent oxide thin film is an amorphous oxide thin film chiefly composed of gallium, indium, and oxygen or composed of gallium and oxygen, and the gallium content of the transparent oxide thin film ranges from 35 at. % to 100 at. % with respect to all metallic atoms. In this way, the present invention has been completed.

Specifically, the transparent conductive film according to a first aspect of the present invention has a lamination structure that the surface of a metallic thin film is coated with a transparent oxide thin film. In this case, the transparent oxide thin film is an amorphous oxide thin film chiefly composed of gallium, indium, and oxygen or composed of gallium and oxygen, and the gallium content of the transparent oxide thin film ranges from 35 at. % to 100 at. % with respect to all metallic atoms.

The transparent conductive film according to a second aspect of the present invention has a three-layer structure that a metallic thin film is sandwiched between transparent oxide thin films. In this case, each of the transparent oxide thin films is an amorphous oxide thin film chiefly composed of gallium, indium, and oxygen or composed of gallium and oxygen, and the gallium content of each transparent oxide thin film ranges from 35 at. % to 100 at. % with respect to all metallic atoms.

In the transparent conductive film according to a third aspect of the present invention, the metallic thin film is preferably constructed with a single layer having at least one, as a main component, selected from among metallic elements such as silver, gold, platinum, palladium, rhodium, iridium, ruthenium, osmium, nickel, copper, and aluminum, or with the laminated layer of at least two kinds of single-layer films of different compositions.

In the transparent conductive film according to a fourth aspect of the present invention, the metallic thin film is preferably a silver alloy that contains silver as a main component and has a gold content ranging from 0.1 at. % from 4.0 at. %.

In the transparent conductive film according to a fifth aspect of the present invention, the metallic thin film is preferably a silver alloy that contains silver as a main component and has a gold content ranging from 0.1 at. % from 2.5 at. % and a copper content ranging from 0.1 at. % to 1.0 at. %.

In the transparent conductive film according to a sixth aspect of the present invention, the metallic thin film is preferably a lamination film of nickel and gold.

In the transparent conductive film according to a seventh aspect of the present invention, the metallic thin film preferably ranges in thickness from 1 nm to 20 nm.

In the transparent conductive film according to an eighth aspect of the present invention, the metallic thin film preferably ranges in thickness from 5 nm to 20 nm.

A ninth aspect of the present invention is that, in the transparent conductive film having the three-layer structure according to the second aspect of the present invention, the metallic thin film ranges in thickness from 1 nm to 20 nm and contains one selected from among metallic elements such as silver, gold, platinum, palladium, rhodium, iridium, ruthenium, and osmium, the content of the selected metallic element being 96 at. % or more.

In the transparent conductive film according to a tenth aspect of the present invention, the metallic thin film is preferably a silver alloy that has a gold content ranging from 0.1 at. % to 4.0 at. %.

In the transparent conductive film according to an eleventh aspect of the present invention, the metallic thin film is preferably a silver alloy that has a gold content ranging from 0.1 at. % to 2.5 at. % and a copper content ranging from 0.1 at. % to 1.0 at. %.

In the transparent conductive film according to a twelfth aspect of the present invention, the transmittance of light with a wavelength of 380 nm in the film itself is preferably more than 80%.

In the transparent conductive film according to a thirteenth aspect of the present invention, the transmittance of light with a wavelength of 320 nm in the film itself is preferably more than 62%.

In the transparent conductive film according to a fourteenth aspect of the present invention, the transmittance of light with a wavelength of 300 nm in the film itself is preferably more than 56%.

In the transparent conductive film according to a fifteenth aspect of the present invention, the surface resistance is preferably less than 20 $\Omega/\square$.

The transparent conductive base material according to a sixteenth aspect of the present invention comprises the transparent conductive film according to any one of the first to fifteenth aspects of the present invention, formed on one or each surface of a transparent substrate of one selected from materials such as a glass plate, a quartz plate, a resin plate or resin film, one or each surface of which is coated with a gas barrier film, and a resin plate or resin film into which the gas barrier film is inserted.

In the transparent conductive base material according to a seventeenth aspect of the present invention, the gas barrier film is preferably at least one selected from among films such as a silicon oxide film, a silicon oxide-nitride film, a magnesium aluminate film, a tin oxide-based film, and a diamond-like carbon film.

In the transparent conductive base material according to an eighteenth aspect of the present invention, the resin plate or the resin film is preferably formed of polyethylene terephthalate (PET), polyether sulfone (PES), polyarylate (PAR), polycarbonate (PC), or polyethylene naphthalate (PEN), or has a lamination structure that the surface of such a substance is coated with acrylic-based organic matter.

In the transparent conductive base material according to a nineteenth aspect of the present invention, the transmittance of light with a wavelength of 380 nm is preferably more than 70%.

In the transparent conductive base material according to a twentieth aspect of the present invention, the transmittance of light with a wavelength of 320 nm is preferably more than 65%.

In the transparent conductive base material according to a twenty-first aspect of the present invention, the transmittance of light with a wavelength of 300 nm is preferably more than 60%.

In the transparent conductive base material according to a twenty-second aspect of the present invention, the surface resistance is preferably less than 20$\Omega/\square$.

In the method of fabricating the transparent conductive film according to a twenty-third aspect of the present invention, the amorphous oxide thin film used for the transparent conductive film having the lamination structure according to the first or second aspect of the present invention is formed in such a way that an oxide sintered body chiefly composed of gallium and indium and having the gallium content ranging from 35 at. % to 100 at. % with respect to all metallic atoms is used as raw material, a mixed gas of argon and oxygen is used as a sputter gas for gas pressure through the sputtering process, the total gas pressure is set to 0.2-0.8 Pa, and the oxygen content is set to 0-5.5%.

In the light-emitting device according to a twenty-fourth aspect of the present invention, the transparent conductive film according to any one of the first to fifteenth aspects of the present invention is used for the transparent electrode.

Effect of the Invention

The present invention is capable of bringing about the transparent conductive film in which the surface resistance is 6-500$\Omega/\square$ and the transmittance of light in the visible region of short wavelengths of 380-400 nm is 80% or more which formerly have never been obtained. Furthermore, by optimizing a film composition, it is possible to realize the transparent conductive film with high transmittancy in the near-ultraviolet region that the surface resistance is 6-500$\Omega/\square$ and the transmittance of light with a wavelength of 320 nm in the film itself is 62% or more or the transmittance of light with a wavelength of 300 nm in the film itself is 56% or more.

In addition, the transparent conductive film of the present invention has the advantage that the film can be formed on a low-temperature substrate (at room temperatures less than 100° C.) by using a sputtering process or an electron-beam evaporation technique which is a thin film fabrication method widely applied in industry.

When the transparent conductive film of the present invention is particularly used as the electrode for the self-emission type element such as the organic EL element, the taking-out efficiency of light in the visible region of short wavelengths can be improved. Even when it is used as the electrode of a device utilizing a blue or near-ultraviolet LED, a laser, or an organic or inorganic EL element, it becomes possible to secure the high transmittance of light in the visible region of short wavelengths and the near-ultraviolet region to be used, which is useful.

Moreover, since the transparent conductive film can also be utilized for the transparent electrode of the solar cell of high conversion efficiency such that near-ultraviolet solar radiation is converted into electric power, the present invention is extremely useful in industry.

The transparent conductive base material of the present invention is obtained in such a way that the gas barrier film is formed, when occasion demands, not only on a glass substrate or a quartz substrate, but also on a heat-resistance-free resin substrate or a flexible resin film substrate and the transparent conductive film of the present invention is further formed. Thus, regardless of the shape and contour of a device, the transparent conductive base material can be widely used as the base material for a flexible display device using a resin film substrate, for example, for a transparent organic EL element, an inorganic El element, an LCD, or an electronic paper, and has an extremely high value in industry.

BEST MODE FOR CARRYING OUT THE INVENTION

The transparent conductive film of the present invention has a lamination structure that the surface of a metallic thin film is coated with a transparent oxide thin film. In this case, the transparent oxide thin film is an amorphous oxide thin film chiefly composed of gallium, indium, and oxygen or composed of gallium and oxygen, and the gallium content of the transparent oxide thin film ranges from 35 at. % to 100 at. % with respect to all metallic atoms.

In the transparent conductive film having a three-layer structure that a metallic thin film is sandwiched between transparent oxide thin films, each of the transparent oxide thin films is an amorphous oxide thin film chiefly composed of gallium, indium, and oxygen, and the gallium content of each transparent oxide thin film ranges from 35 at. % to 100 at. % with respect to all metallic atoms.

Figure 3:
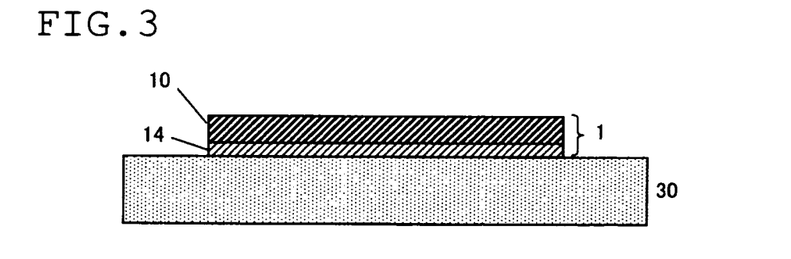
FIG. 3 is a sectional view showing a fundamental structure of the transparent conductive base material on which the transparent conductive film is formed.

Specifically, as shown in FIG. 3, in a transparent conductive film 1 having a lamination structure that the surface of a metallic thin film 14 is coated with a transparent oxide thin film 10, the metallic thin film 14 is constructed with a single layer having at least one, as a main component, selected from among metallic elements such as silver, gold, platinum, palladium, rhodium, iridium, ruthenium, osmium, nickel, copper, and aluminum, or with the laminated layer of at least two kinds of single-layer films of different compositions. In addition, the transparent oxide thin film 10 is an amorphous oxide thin film chiefly composed of gallium, indium, and oxygen or composed of gallium and oxygen, and the gallium content of the transparent oxide thin film ranges from 35 at. % to 100 at. % with respect to all metallic atoms.

Figure 1:
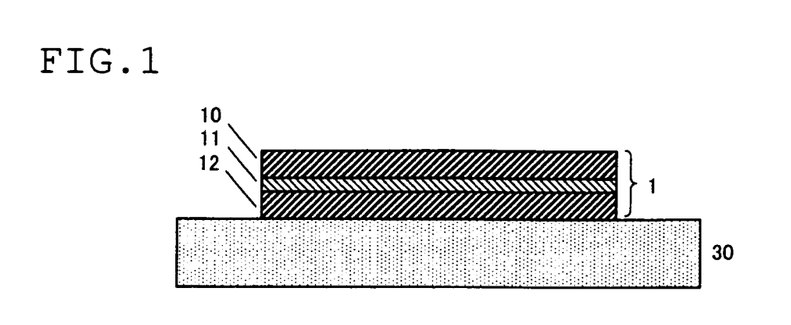
FIG. 1 is a sectional view showing a fundamental structure of the transparent conductive base material on which the transparent conductive film is formed.

Further, the transparent conductive film of the present invention is such that, in the transparent conductive film 1 having a lamination structure that a metallic thin film 11 such as that shown in FIG. 1 is sandwiched between transparent oxide thin films 10 and 12, the metallic thin film 11 has one, as a main component, selected from among metallic elements such as silver, gold, platinum, palladium, rhodium, iridium, ruthenium, osmium, nickel, copper, and aluminum, and each of the transparent oxide thin films 10 and 12 is an amorphous oxide thin film chiefly composed of gallium, indium, and oxygen or composed of gallium and oxygen, and the gallium content of each transparent oxide thin film ranges from 35 at. % to 100 at. % with respect to all metallic atoms.

It is desirable that the metallic thin film 11, 14 has a high conductivity (less than 100 μΩcm in terms of the resistivity). Specifically, it is desirable that the metallic thin film 11 has one, as a main component, selected from among metallic elements such as silver, gold, platinum, palladium, rhodium, iridium, ruthenium, osmium, nickel, copper, and aluminum, and it may be constructed with a single layer or the lamination of at least two layers of different compositions (indicated by reference numeral 14 of FIG. 4, for instance).

Silver exhibits the lowest resistivity in the above element group and retains a high transmittance of light in the visible region, notably on the short-wavelength side of 380-400 nm. However, silver is inferior in corrosion resistance to gold and platinum. When silver is used in applications requiring high corrosion resistance, alloying is effective, that is, it is effective that the content of at least one kind of element other than silver ranges from 0.1 at. % to 4.0 at. %.

It is desirable that an additive element other than silver is gold. It is desirable that the content of gold to be added ranges from 0.1 at. % to 4.0 at. %. The gold content below 0.1 at. % is unfavorable because the corrosion resistance is lowered. On the other hand, the gold content beyond 4.0 at. % causes the problem that the conductivity and the transmittance of light in the visible wavelength region are impaired. Also, copper may be added together with gold. In this case, from the same reason as the above description, it is desirable that the gold content ranges from 0.1 at. % to 2.5 at. % and the copper content ranges from 0.1 at. % to 1.0 at. %. It is also desirable that the metallic thin film is a laminated film of nickel and gold.

It is desirable that the thickness of the metallic thin film is between 1 nm and 20 nm. It is more desirable that the thickness is between 5 nm and 20 nm. If the thickness is below 1 nm, a stable surface resistance value cannot be obtained. In order to obtain a lower surface resistance, it is desirable that the metallic thin film ranges in thickness from 5 nm to 20 nm. If the thickness is beyond 20 nm, the high transmittance of light cannot be obtained.

Each of the transparent oxide thin films 10 and 12 is an amorphous oxide thin film chiefly composed of gallium, indium, and oxygen or composed of gallium and oxygen and needs to have the gallium content ranging from 35 at. % to 100 at. % with respect to all metallic atoms. If the gallium content is below 35 at. % with respect to all metallic atoms, the transmittance of light in the visible region of short wavelengths will be reduced. Beyond 65 at. %, the resistivity of the transparent oxide thin film is increased, but the conductivity of the laminated film with a silver-alloy thin film is ensured because the transparent oxide thin film possesses defects.

The amorphous oxide thin film of the present invention contains gallium, indium, and oxygen as chief constituent elements, but may contain elements other than these, for example, tin, titanium, tungsten, molybdenum, zirconium, hafnium, silicon, germanium, iron, and fluorine, to the extent that the characteristics of the present invention are not impaired by such elements.

In the transparent conductive film having the three-layer structure mentioned above, it is desirable to have the characteristics that the metallic thin film ranges in thickness from 1 nm to 20 nm and contains one selected from among metallic elements such as silver, gold, platinum, palladium, rhodium, iridium, ruthenium, and osmium, the content of the selected metallic element being 96 at. % or more.

It is particularly desirable that the metallic thin film is a silver alloy that has a gold content ranging from 0.1 at. % to 4.0 at. %. It is also desirable that the metallic thin film is a silver alloy that has a gold content ranging from 0.1 at. % to 2.5 at. % and a copper content ranging from 0.1 at. % to 1.0 at. %.

In the transparent conductive film constructed as described above, the transmittance of light with a wavelength of 380 nm in the film itself, ranging from the visible region of short wavelengths to the near-ultraviolet region, can be set to 80% or more. The transmittance of light with a wavelength of 320 nm in the film itself, in the near-ultraviolet region of shorter wavelengths of 300-380 nm, can be set to 62% or more. In addition, the transmittance of light with a wavelength of 300 nm in the film itself can be set to 56% or more.

The surface resistance of the transparent conductive film constructed as mentioned above can be set to 20Ω/□ or less and the transparent conductive film can be formed as the film having a low surface resistance.

The transparent conductive film of the present invention, as discussed above, is a transparent conductive laminated thin film which not only has the high transmittance of light in the visible region and the low surface resistance, but also combines the high transmittances of light in the visible region of short wavelengths of 380-400 nm and the near-ultraviolet region of shorter wavelengths of 300-380 nm. Hence, by utilizing the characteristic that the high transmittance is retained in the visible region of short wavelengths, the transparent conductive film can be used as the electrode not only of the organic EL element or the LED element, but also of the luminescent material or the light-emitting device that has the function of blue light emission or near-ultraviolet emission, or the solar cell converting solar radiation into electric power.

As methods of depositing the transparent conductive film of the present invention, a sputtering process, an electron-beam vacuum evaporation technique, an ion plating process, a solution coating method, and a CVD technique are cited as examples. In view of productivity, a magnetron sputtering process using DC plasma (a DC-magnetron sputtering process) is favorable.

In this case, in order to obtain stable characteristics, it is desirable that the amorphous oxide thin film used for the transparent conductive film is deposited in such a way that an oxide sintered body chiefly composed of gallium and indium and having the gallium content ranging from 35 at. % to 100 at. % with respect to all metallic atoms is used as raw material, a mixed gas of argon and oxygen is used as a sputter gas for gas pressure through the sputtering process, the total gas pressure is set to 0.2-0.8 Pa, and the oxygen content of the mixture is set to 0-5.5%.

The transparent conductive base material comprises the transparent conductive thin film 1 of the present invention formed on one or each surface of a transparent substrate 30 or a resin film substrate 31. In FIGS. 1-4, the structure that the transparent conductive thin film 1 of the present invention is formed on one surface of the transparent substrate 30 is shown.

As the transparent substrate 30, a glass plate, a quartz plate, a resin plate or resin film, one or each surface of which is coated with the gas barrier film (reference numeral 20 in FIG. 2), or a resin plate or resin film into which the gas barrier film is inserted is used. Moreover, on the transparent substrate 30, a thin film transistor (TFT) and a metallic electrode for driving it may be formed to the extent that the transparency of the substrate is not completely impaired.

The resin plate or the resin film is higher in transmittance of gas than the glass plate. The light-emitting layer of the organic or inorganic EL element and the liquid crystal layer of the LCD are deteriorated by moisture and oxygen. Thus, when the resin plate or the resin film is used as the substrate of each of these display elements, it is desirable that the gas barrier film blocking the passage of gas is applied.

The gas barrier film may be formed on one surface of the resin plate or the resin film. When the gas barrier film is formed on each surface thereof, the blockage of the passage of gas is much improved. The gas barrier film is formed on one surface of the resin plate or resin film and another resin plate or resin film is laminated on the gas barrier film, thereby giving the structure that the gas barrier film is inserted thereinto. Moreover, the transparent conductive film can be constructed so that the lamination is repeated a plurality of times.

It is desirable that the resin plate or the resin film is formed of polyethylene terephthalate (PET), polyether sulfone (PES), polyarylate (PAR), polycarbonate (PC), or polyethylene naphthalate (PEN), or has a lamination structure that the surface of such a material is coated with a hard coat layer representative of acrylic-based organic matter. However, the resin plate or the resin film is not limited to such a structure. The thickness of the resin plate or the resin film is properly selected in accordance with specific applications described below.

It is desirable that the gas barrier film is at least one selected from films such as a silicon oxide film, a silicon oxide-nitride (SiON) film, a magnesium aluminate film, a tin oxide-based film, and a diamond-like carbon (DLC) film. However, the gas barrier film is not limited to such a film.

Here, the tin oxide-based film has a composition containing at least one selected, for example, from additive elements such as Si, Ce, and Ge, added to tin oxide. By such an additive element, a tin oxide layer is amorphized so that a dense film is formed. The transparent conductive thin film may be formed on the substrate having the structure that at least one gas barrier film selected from the films such as the silicon oxide film, the silicon oxide-nitride film, the magnesium aluminate film, the tin oxide-based film, and the diamond-like carbon film and an organic or polymer film are alternately laminated over and over again on the surface of the resin plate or the resin film.

In the transparent conductive base material constructed as mentioned above, the transmittance of light of wavelength 380 nm can be set to 70% or more. The transmittance of light of wavelength 320 nm can also be set to 65% or more. Further, the transmittance of light of wavelength 300 nm can be set to 60% or more.

The surface resistance of the transparent conductive base material constructed as mentioned above can be set to 20Ω/□ or less.

Figure 5:
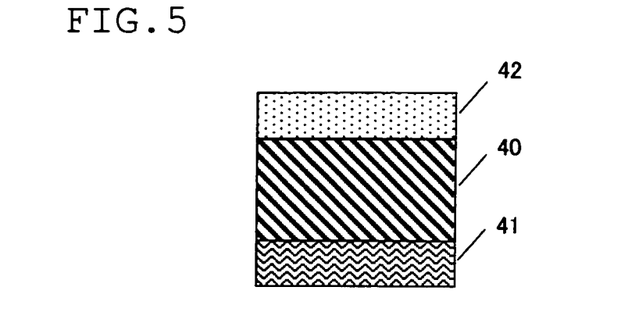
FIG. 5 is a sectional view showing a fundamental structure of the organic EL element.
Figure 6:
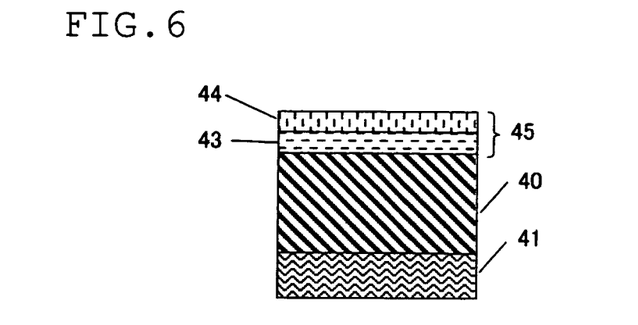
FIG. 6 is a sectional view showing a fundamental structure of the organic EL element in which the transparent conductive film of the present invention is used for a cathode.
Figure 7:
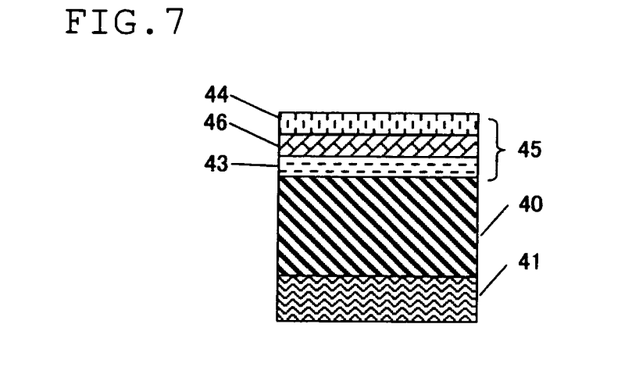
FIG. 7 is a sectional view showing a fundamental structure of the organic EL element in which the transparent conductive film of the present invention is used for the cathode.

From the above description, when the transparent conductive film of the present invention is used as the electrode for the self-luminous type element such as the organic EL element, the taking-out efficiency of light in the visible region of short wavelengths can be improved. The organic EL element, as illustrated in FIG. 5, has the structure that a laminated film 40 of an organic compound (in which a high polymer compound is also contained) film including the light-emitting layer is sandwiched between an anode 41 and a cathode 42, and is formed on the substrate. The transparent conductive film of the present invention can be used for the anode 41 (a material with a work function of 4.4 eV or more is favorable) or/and for the cathode 42 (a material with a work function of 3.8 eV or less is favorable). It is desirable that the transparent conductive film of the present invention where it is used as the cathode, as shown in FIG. 6, includes at least one layer of a metallic thin film 43 with a low work function (for example, a metallic film composed of Mg, Cs, Ba, Sr, Yb, Eu, Y, Sc, and Li, or an alloy film included as a partial component). A transparent conductive film 45 of the present invention is constructed as the lamination of this metallic thin film 43 and a transparent oxide thin film 44. It is desirable that the metallic thin film 43 with the low work function is disposed so as to come in contact with the laminated film 40 of the organic compound. Also, as shown in FIG. 7, besides the metallic thin film 43 of the low work function, another metallic thin film 46 (for example, an Ag-, Al-, or Cr-based film) for assisting conductivity may be combined.

Figure 8:
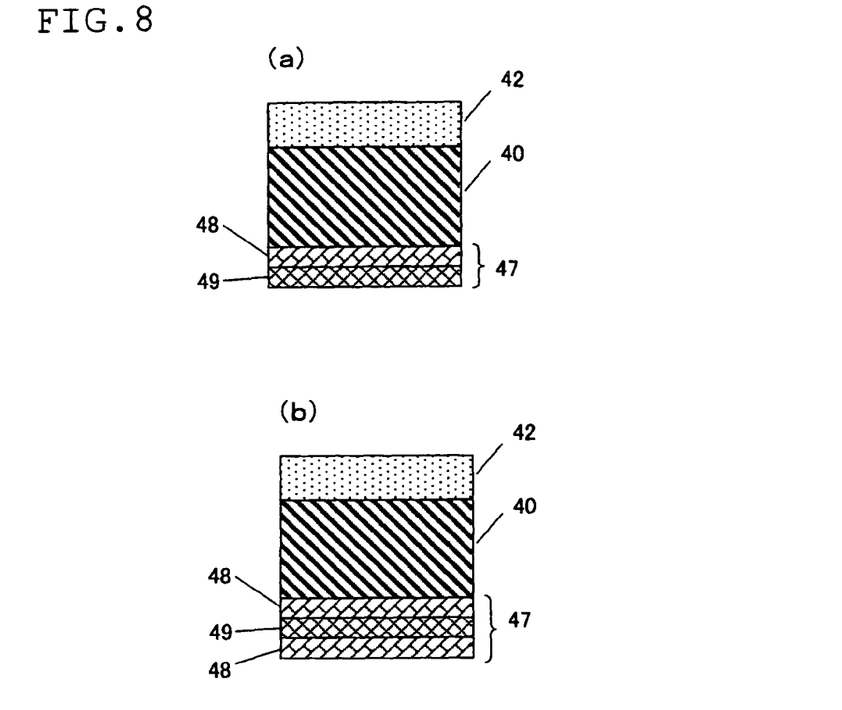
FIG. 8 is a sectional view showing two kinds of fundamental structures (a) and (b) of the organic EL elements in which the transparent conductive film of the present invention is used for an anode.
Figure 9:
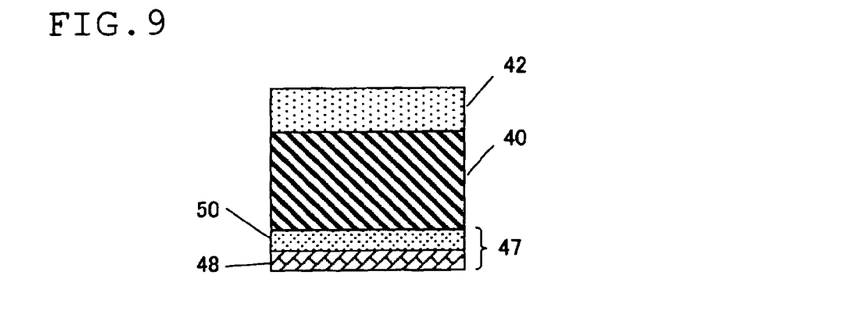
FIG. 9 is a sectional view showing a fundamental structure of the organic EL element in which the transparent conductive film of the present invention is used for the anode.
Figure 10:
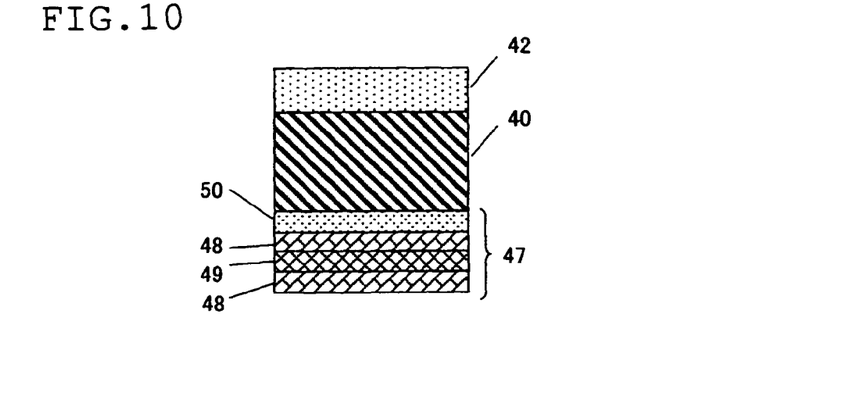
FIG. 10 is a sectional view showing a fundamental structure of the organic EL element in which the transparent conductive film of the present invention is used for the anode.

When the transparent conductive film of the present invention is used as the anode, as shown in FIG. 8($a$) and FIG. 8($b$), a transparent conductive film 47 of the present invention may be disposed so that a transparent oxide thin film 48 comes in contact with the laminated film 40 of the organic compound. This is because the transparent oxide thin film 48 in the transparent conductive film 47 of the present invention has the work function as high as 5 eV or more. It is desirable that a metallic thin film 49 in this case has one, as a main component, selected from among metallic elements such as silver, gold, platinum, palladium, rhodium, iridium, ruthenium, osmium, nickel, copper, and aluminum, which are excellent in conductivity. However, the main component of the metallic thin film 49 is not limited to such a metallic element. Although, as shown in FIG. 9, a metallic thin film 50 may be disposed so as to come in contact with the laminated film 40 of the organic compound, the metallic thin film 50 in this case is preferably formed as a metallic thin film with a high work function (for example, a metallic material having an element such as Au, Pt, Ni, Pd, Cr, W, or Ag, or an alloy material having such elements as components). In addition, as shown in FIG. 10, a metallic thin film 49 of a metallic material excellent in conductivity (for example, a metallic material having one, as a main component, selected from among metallic elements such as silver, gold, platinum, palladium, rhodium, iridium, ruthenium, osmium, nickel, copper, and aluminum) may be used on the side that does not contact with the laminated film 40 of the organic compound, regardless of the value of the work function.

In the organic EL element of any structure mentioned above, each of the transparent oxide thin films 44 and 48 needs to use the transparent oxide thin film which is the amorphous oxide thin film chiefly composed of gallium, indium, and oxygen or composed of gallium and oxygen and which has the composition that the gallium content ranges from 35 at. % to 100 at. % with respect to all metallic atoms, particularly maintained by the present invention. Whereby, in contrast to the case where the conventional ITO film is used, the organic EL element with a high intensity of blue light emission can be realized.

Even when the transparent conductive film is used as the electrode of the device utilizing the blue or near-ultraviolet LED, the laser, or the organic or inorganic EL element, it becomes possible to secure the high transmittance of light in the visible region of short wavelengths and the near-violet region to be used, and the present invention is useful. Moreover, since the transparent conductive film can also be utilized for the transparent electrode of the solar cell of high conversion efficiency that near-ultraviolet solar radiation is converted into electric power, the present invention is extremely useful in industry.

EMBODIMENTS

Embodiments 1-8

Figure 2:
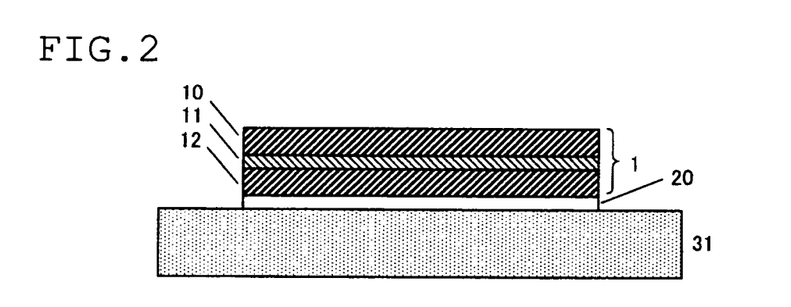
FIG. 2 is a sectional view showing a fundamental structure of the transparent conductive base material in which the gas barrier film is formed on the base material and the transparent conductive film is formed thereon.

The structure of each of these embodiments will be first described in accordance with FIGS. 1 and 2.

FIG. 1 is a sectional view showing a fundamental structure of the transparent conductive base material used as Embodiments 1-7. The transparent conductive film 1 of a lamination structure is fabricated which includes the transparent oxide thin film 12 with a thickness of 40 nm, a silver-based alloy thin film with a thickness of 10 nm as the metallic thin film 11, and the transparent oxide thin film 10 with a thickness of 40 nm, successively laminated on the glass substrate (a 7059 substrate or 7059 glass substrate by Corning Inc.) 30.

The transparent oxide thin films 10 and 12 and the silver-based alloy thin film 11 are deposited through a direct-current magnetron sputtering method, using an SPF-530H sputtering device made by ANELVA Corporation. By using the target of an oxide sintered body (Ga—In—O) containing gallium and indium, each of the transparent oxide thin films 10 and 12 is deposited by adjusting the time so that a preset film thickness is reached, at a making power of DC 200 W under the conditions of a gas pressure of 0.5 Pa with a gas mixture of argon and oxygen and a proportion of an oxygen flow rate of 1.5%. As a result of a composition analysis by an ICP optical emission analysis technique relative to a film fabricated on an Si substrate (99.999% pure) under these conditions, it is confirmed that the film has almost the same composition (the ratio of the number of atoms, Ga/In) as the target. By using a gold-added silver alloy target or a gold- and copper-added silver alloy target, the silver-based alloy thin film 11 is deposited by adjusting the time so that a preset film thickness is reached, at a making power of DC 50 W under the condition of a gas pressure of 0.5 Pa with an argon gas. In the silver-based alloy thin film also, the composition analysis by the ICP optical emission analysis technique is made relative to the film fabricated on the Si substrate (99.999% pure) under this condition, and it is confirmed that the film has almost the same alloy composition as the target.

FIG. 2 is a sectional view showing a fundamental structure of the transparent conductive base material used as Embodiment 8. A PES film (FST-UCPES by SUMITOMO BAKELITE CO., LTD.) with a thickness of 200 μm is used as the resin film substrate 31, and the silicon oxide-nitride (SiON) film with a thickness of 100 nm is previously formed as the gas barrier film 20 on this substrate so that the transparent conductive film 1 identical with that of Embodiments 1-7 is formed on the gas barrier film.

The surface resistance of the transparent conductive film 1 obtained in each of Embodiments 1-8 is measured by the 4-pin probe technology of a resistivity meter, Loresta-EP (MCP-T360 by Dia Instruments Co. Ltd.). The transmittance of light ($T_{S+F}$ (%)) of the transparent conductive film with the substrate is measured by a spectrophotometer (U-4000 by Hitachi, Ltd.). On the same condition, the transmittance of light ($T_S$ (%)) of the substrate alone is also measured to calculate the value of ($T_{S+F}/T_S$)×100 as the transmittance of light ($T_F$ (%)) of the film itself.

In cases where the content of gold added to the silver-based alloy thin film 11 is fixed to 2.5 at. % to change the gallium content ({Ga/(Ga+In)}×100(%)) of each of the transparent oxide thin films 10 and 12 (Embodiments 1-3), where the gallium content of each of the transparent oxide thin films 10 and 12 is fixed to 50 at. % to change the content of gold added to the silver-based alloy thin film 11 (Embodiment 4-6), where copper is added to the silver-based alloy thin film 11 (Embodiment 7), and where the gas barrier film 20 is sandwiched between the transparent conductive film 1 and the base material, variations in the surface resistance value and the transmittance of light of wavelength 380 nm relative to the film with the substrate and to the film itself are shown in Table 1.

TABLE 1

| | Gallium content of transparent oxide thin film | Gold content of silver-based alloy thin film | Copper content of silver-based alloy thin film | Surface resistance value of transparent conductive film | Transmittance of light (wavelength 380 nm) | |
|---|---|---|---|---|---|---|
| | [at. %] | [at. %] | [at. %] | [Ω/□] | $T_{S+F}$ (%) | $T_F$ (%) |
| Embodiment 1 | 35 | 2.5 | — | 5.07 | 80.1 | 88.7 |
| Embodiment 2 | 50 | 2.5 | — | 5.12 | 83.0 | 91.9 |
| Embodiment 3 | 65 | 2.5 | — | 5.92 | 84.1 | 93.1 |
| Embodiment 4 | 50 | 0.1 | — | 3.80 | 83.8 | 92.8 |
| Embodiment 5 | 50 | 1.0 | — | 3.99 | 83.1 | 92.0 |
| Embodiment 6 | 50 | 4.0 | — | 5.93 | 80.6 | 89.3 |
| Embodiment 7 | 50 | 1.0 | 0.5 | 5.35 | 80.7 | 89.4 |
| Embodiment 8 | 50 | 1.0 | — | 4.98 | 70.5 | 88.3 |

Each of the transparent oxide thin films 10 and 12 is formed as the amorphous oxide thin film composed of gallium, indium, and oxygen, and its composition is changed to provide three kinds of gallium contents of 35, 50, and 65 at. % with respect to all metallic atoms. The silver-based alloy thin film 11 is formed as an alloy thin film in which gold is added to silver to provide four kinds of gold contents of 0.1, 1.0, 2.5, and 4.0.

In the transparent conductive film obtained in each of Embodiments 1-8, a sectional sample is produced by FIB (focused ion beam) processing, and from the observation of a sectional structure under a transmission electron microscope (TEM), it is confirmed that film thicknesses of individual layers of the transparent oxide thin film and the silver-based alloy thin film are retained according to the design. Further, from measurements by an electron diffractograph attached to the TEM, it is confirmed that the transparent oxide thin film has the amorphous structure.

In the transparent conductive film in each of Embodiments 1-8, the average transmittance in the visible region (400-800 nm) relative to the film itself is 87% or more and even the average transmittance in the visible region (400-800 nm) relative to the film with the substrate is 80% or more. It is thus confirmed that transparency in the visible region is excellent. As seen from Table 1, when the gallium content of each of the transparent oxide thin films 10 and 12 is set to the range of 35-65 at. % so that a gold-contained silver alloy thin film in which gold is added to the metallic thin film in the range of 0.1-4.0 at. % or a silver alloy thin film containing 1.0 at. % gold and 0.5 at. % copper is used, the transparent conductive film exhibits an extremely high electrical conductivity that the surface resistance is less than 10Ω/□, and preserves the transmission characteristic of light that the transmittance of light of wavelength 380 nm relative to the film itself is as high as more than 88%. The transmittance of light of wavelength 380 nm relative to the film with the substrate is more than 80% for the use of the 7059 glass substrate (Embodiments 1-7) and is as high as more than 70% for the PES film. Thus, the transparent conductive film and the transparent conductive base material of low resistance values which have the high conductivity and the high transmittance in a wavelength region of 380-800 nm can be realized.

Hence, such a transparent conductive film or a transparent conductive base material is extremely useful as the transparent electrode of the device utilizing the blue LED, the laser, or the organic or inorganic EL element.

Embodiments 9 and 10

The fundamental structure of each of Embodiments 9 and 10 is the same as that of each of Embodiments 1-7 shown in FIG. 1 with the exception that the gold thin film 11 of 5 nm in thickness or the rhodium thin film 11 of 8 nm in thickness is used as the metallic thin film 11 instead of the silver-based alloy thin film 11 of 10 nm in thickness. The gallium content of each of the transparent oxide thin film 10 and 12 is fixed to 50 at. %. Each film is fabricated by the sputtering process under the same condition as in Embodiments 1-8.

The surface resistance of the transparent conductive film 1 thus obtained is measured by the 4-pin probe technology of the resistivity meter, Loresta-EP (MCP-T360 by Dia Instruments Co., Ltd.). The transmittance of light ($T_{S+F}$ (%)) of the transparent conductive film with the substrate is measured by the spectrophotometer (U-4000 by Hitachi, Ltd.). On the same condition, the transmittance of light ($T_S$ (%)) of the substrate alone is also measured to calculate the value of ($T_{S+F}/T_S$)×100 as the transmittance of light ($T_F$ (%)) of the film itself.

In the transparent conductive film obtained in each of Embodiments 9 and 10, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

In the transparent conductive film in each of Embodiments 9 and 10, the average transmittance in the visible region (480-800 nm) relative to the film itself is 87% or more and even the average transmittance in the visible region (480-800 nm) relative to the film with the substrate is 80% or more. It is thus confirmed that transparency in the visible region is excellent. Variations in the surface resistance value and the transmittance of light of wavelength 380 nm of the transparent conductive film 1 in Embodiments 9 and 10 are shown in Table 2.

As seen from Table 2, the transparent conductive film of each of Embodiments 9 and 10 exhibits an extremely high electrical conductivity that the surface resistance is less than 10Ω/□, and preserves the transmission characteristic of light that the transmittance of light of wavelength 380 nm relative to the film itself is as high as more than 88%. The transmittance of light of wavelength 380 nm relative to the film with the substrate is as high as more than 80%. Thus, the transparent conductive film and the transparent conductive base material of low resistance values which have the high conductivity and the high transmittance in a wavelength region of 380-800 nm can be realized.

Hence, such a transparent conductive film or a transparent conductive base material is extremely useful as the transparent electrode of the device utilizing the blue LED, the laser, or the organic or inorganic EL element.

In the transparent conductive film obtained, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

When the thickness of the silver-based alloy thin film 11 is changed to 1.2, 1.6, 3.1, and 4.0 so as to be smaller than in Embodiments 1-8, the surface resistance tends to increase, but the transparent conductive film with a surface resistance of 100-500Ω/□ is obtained. The average transmittance in the visible region (480-800 nm) relative to the film itself is 87% or more and even the average transmittance in the visible region (480-800 nm) relative to the film with the substrate is 80% or more. It is thus confirmed that transparency in the visible region is excellent. The transparent conductive film 1 in which the transmittance of light of wavelength 380 nm relative to the film itself is 90% or more and that relative to the film with the substrate is 80% or more is obtained. The aver-

TABLE 2

| | Gallium content of transparent oxide thin film | Kind/thickness of metallic thin film | Surface resistance value of transparent conductive film | Transmittance of light (wavelength 380 nm) | |
| --- | --- | --- | --- | --- | --- |
| | [at. %] | [at. %] | [Ω/□] | $T_{S+F}$ (%) | $T_F$ (%) |
| Embodiment 9 | 50 | Gold thin film/5 nm | 6.28 | 82.1 | 90.9 |
| Embodiment 10 | 50 | Rhodium thin film/8 nm | 6.44 | 80.1 | 88.7 |

Embodiment 11

The fundamental structure of the transparent conductive base material used as Embodiment 11 is the same as in FIG. 1. For the substrate 30, a PET film (made by TOYOBO CO., LTD.) with a thickness of 100 μm is used. For the metallic thin film 11, the silver alloy thin film in which palladium is dissolved by 1 at. % is used, and for each of the transparent oxide film 10 and 12, a Ga—In—O amorphous transparent oxide film in which the gallium content ({Ga/(Ga+In)}×100(%)) is 50 at. % is used. In this embodiment, a take-up sputtering device is used to perform deposition while carrying a PET film substrate. In deposition, a film-thickness monitor is used to make sure of the film thickness, and the film thickness of each layer is controlled by the technique of making the fine adjustment of carrying speed so that a preset film thickness is obtained. The thickness of each of the transparent oxide films 10 and 12 is set to 40 nm and that of the silver-based alloy thin film 11 is changed to 1.2, 1.6, 2.1, 4.0, 12.3, 15.2, and 19.5 nm so that three-layer-structure transparent conductive films including the silver-based alloy thin films of different thicknesses are experimentally fabricated.

The surface resistance of the transparent conductive film 1 obtained in this way is measured by the 4-pin probe technology of the resistivity meter, Loresta-EP (MCP-T360 by Dia Instruments Co., Ltd.). The transmittance of light ($T_{S+F}$ (%)) of the transparent conductive film with the substrate is measured by the spectrophotometer (U-4000 by Hitachi, Ltd.). On the same condition, the transmittance of light ($T_S$ (%)) of the substrate alone is also measured to calculate the value of ($T_{S+F}/T_S$)×100 as the transmittance of light ($T_F$ (%)) of the film itself.

age transmittance in the visible region relative to the film itself is 88% or more and the transparent conductive film, like Embodiment 9, has an excellent transparency of light.

When the thickness of the silver-based alloy thin film 11 is changed to 12.3, 15.2, and 19.5 nm so as to be larger than in Embodiments 1-8, the surface resistance tends to reduce, and the transparent conductive film of the surface resistance as low as 2-3Ω/□ is obtained. In the transparent conductive film 1, the average transmittance in the visible region (480-800 nm) relative to the film itself is 80% or more, the transmittance of light of wavelength 380 nm relative to the film itself is 60-72%, and that relative to the film with the substrate is 53-64%. In comparison with the transparent conductive film and the transparent conductive base material in Embodiments 1-8, the transmittance of light of wavelength 380 nm is reduced, but is high compared with that of a conventional film or a base material using the conventional film to be described later, and hence it is useful for applications particularly requiring high conductivity.

Thus, the transparent conductive film or transparent conductive base material shown in Embodiment 11 is extremely useful as the transparent electrode of the device utilizing the blue LED, the laser, or the organic or inorganic EL element.

Embodiments 12-17

A fundamental film structure in Embodiments 12-17 is the same as that in Embodiments 1-7 shown in FIG. 1, and a synthetic quartz substrate is used for the substrate 30. The composition of the thin film of each layer is set as described below.

The added-gold content of the silver-based alloy thin film 11 is fixed to 2.5 at. % and the film thickness is set to 7-8 nm.

In each of the transparent oxide thin films 10 and 12, the gallium content relative to all metallic atoms, ({Ga/(Ga+In)}× 100(%), is changed to 48, 62, 80, 90, 98, and 100 at. % and the film thickness is set to 38-44 nm. Each thin film is fabricated by the sputtering technique on the same condition as in Embodiments 1-8. By using the target of an oxide sintered body (Ga—In—O) containing gallium and indium, each of the transparent oxide thin films 10 and 12 is deposited by adjusting the time so that a preset film thickness is reached, at a making power of DC 200-300 W (1.10-1.65 W/cm$^2$ in terms of the DC making power density) under the conditions of a gas pressure of 0.2-0.8 Pa with a pure argon gas or a gas mixture of argon and oxygen and a proportion of an oxygen flow rate of 0-5.5%. As a result of a composition analysis by the ICP optical emission analysis technique relative to a film fabricated on the Si substrate (99.999% pure) under these conditions, it is confirmed that the film has almost the same composition (the ratio of the number of atoms, Ga/In) as the target. By using a gold-added silver alloy target or a gold- and copper-added silver alloy target, the silver-based alloy thin film 11 is deposited by adjusting the time so that a preset film thickness is reached, at a making power of DC 50 W (0.28 W/cm$^2$ in terms of the DC making power density) under the condition of a gas pressure of 0.2-0.8 Pa with a pure argon gas. In the silver-based alloy thin film also, the composition analysis by the ICP optical emission analysis technique is made relative to the film fabricated on the Si substrate (99.999% pure) under this condition, and it is confirmed that the film has almost the same alloy composition as the target.

In the transparent conductive film obtained in each of Embodiments 12-17, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

In the transparent conductive film in each of Embodiments 12-17, the average transmittance in the visible region (480-800 nm) relative to the film itself is 85% or more and even the average transmittance in the visible region (480-800 nm) relative to the film with the substrate is 80% or more. It is thus confirmed that transparency in the visible region is excellent. Variations in the surface resistance value and the transmittance of light of the film with the substrate and of the film itself, at wavelengths of 380 nm, 320 nm, and 300 nm of the transparent conductive film 1 in Embodiments 12-17 are shown in Table 3. As seen from Table 3, the transparent conductive film of each of Embodiments 12-17 exhibits an extremely high electrical conductivity that the surface resistance is 10-14Ω/□, and preserves the transmission characteristic of light that the transmittance of light of wavelength 380 nm relative to the film itself is as high as more than 92%. The transmittance of light of wavelength 380 nm relative to the film with the substrate is as high as more than 85%. Thus, the transparent conductive film and the transparent conductive base material of low resistance values which have the high conductivity and the high transmittance in a wavelength region of 380-800 nm can be realized. The transmittances of light with wavelengths of 320 nm and 300 nm are also listed in Table 3, and it is seen that as the Ga content of the amorphous transparent oxide thin film increases, the transmittance is improved.

In particular, when the Ga content is more than 80%, the film in which the transmittance of light of wavelength 320 nm relative to the film itself is more than 70% and that relative to the film with the substrate is more than 65% can be realized. When the Ga content is more than 90%, the transparent conductive base material that the transmittance of light of wavelength 300 nm relative to the film itself is more than 65% and even the transmittance of light of the film with the substrate is more than 60% can be realized. Thus, by using the transparent conductive thin film of the present invention, the transparent electrode which has a high conductivity that the surface resistance is 10-14Ω/□ and at the same time, is high in transmittance of the near-ultraviolet light with wavelengths of 320 and 300 nm can be realized. By forming this transparent conductive thin film on the substrate, the transparent conductive base material of low resistance in which the transmittance of the near-ultraviolet light is high can be realized.

Hence, such a transparent conductive film or a transparent conductive base material is extremely useful as the transparent electrode of the device utilizing the blue LED, the laser, or the organic or inorganic EL element.

TABLE 3

| | Gallium content of transparent oxide thin film [at. %] | Gold content of silver-based alloy thin film [at. %] | Copper content of silver-based alloy thin film [at. %] | Surface resistance value of transparent conductive film [Ω/□] | Transmittance of light (wavelength 380 nm) | | Transmittance of light (wavelength 320 nm) | | Transmittance of light (wavelength 300 nm) | |
|---|---|---|---|---|---|---|---|---|---|---|
| | | | | | $T_{S+F}$ (%) | $T_F$ (%) | $T_{S+F}$ (%) | $T_F$ (%) | $T_{S+F}$ (%) | $T_F$ (%) |
| Embodiment 12 | 48 | 2.5 | — | 10.42 | 86.0 | 92.7 | 50.6 | 54.6 | 32.0 | 34.6 |
| Embodiment 13 | 62 | 2.5 | — | 11.20 | 86.1 | 92.8 | 57.7 | 62.3 | 38.1 | 41.1 |
| Embodiment 14 | 80 | 2.5 | — | 11.85 | 85.7 | 92.3 | 65.2 | 70.4 | 45.2 | 48.8 |
| Embodiment 15 | 90 | 2.5 | — | 12.11 | 85.8 | 92.5 | 75.6 | 81.6 | 60.2 | 65.0 |
| Embodiment 16 | 98 | 1.0 | 0.5 | 13.51 | 87.5 | 94.3 | 78.5 | 84.8 | 65.4 | 70.6 |
| Embodiment 17 | 100 | 2.5 | — | 12.89 | 88.7 | 95.6 | 80.0 | 86.4 | 68.0 | 73.4 |

Embodiments 18-23

Figure 4:
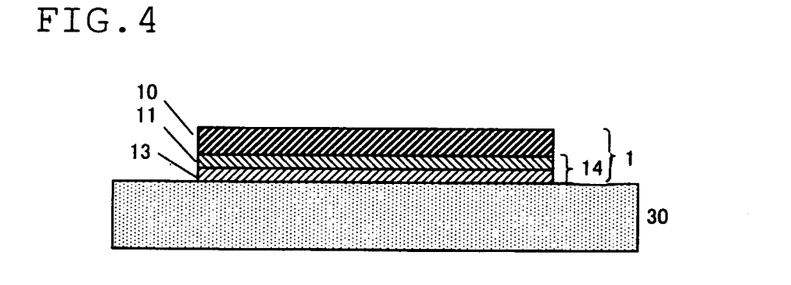
FIG. 4 is a sectional view showing a fundamental structure of the transparent conductive base material on which the transparent conductive film is formed.

The fundamental film structure in Embodiments 18-23 is shown in FIG. 4. The present invention has the structure that the metallic thin film 14 is formed on the substrate 30 and the surface of this film is coated with the transparent oxide film 10.

The synthetic quartz substrate is used for the substrate 30. The metallic thin film 14 is constructed of a nickel thin film 13 and a gold thin film 11 so that the nickel thin film 13 is deposited on the substrate side and has the thickness set to 2 nm and the gold thin film 11 is deposited on the transparent-oxide-film-10 side and has the thickness set to 3 nm. In the transparent oxide thin film 10, the gallium content relative to all metallic atoms, ({Ga/(Ga+In)}×100(%)), is changed to 48, 62, 80, 90, 98, and 100 at. % and the thickness of the transparent oxide thin film 10 is set to 53-60 nm. Each thin film is formed by the sputtering technique under the same condition as in Embodiments 1-8.

In the transparent conductive film obtained in each of Embodiments 18-23, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

more and even the transmittance of light of the film with the substrate is more than 56% can be realized. Thus, by using the transparent conductive thin film of the present invention, the transparent electrode which has a high conductivity that the surface resistance is 15-19Ω/□ and at the same time, is high in transmittance of the near-ultraviolet light at wavelengths of 320 and 300 nm can be realized. By forming this transparent conductive thin film on the substrate, the transparent conductive base material of low resistance in which the transmittance of the near-ultraviolet light is high can be realized.

Hence, such a transparent conductive film or a transparent conductive base material is extremely useful as the transparent electrode of the device utilizing the blue LED, the laser, or the organic or inorganic EL element.

TABLE 4

|  | Gallium content of transparent oxide thin film | Surface resistance value of transparent conductive film | Transmittance of light (wavelength 380 nm) | | Transmittance of light (wavelength 320 nm) | | Transmittance of light (wavelength 300 nm) | |
| --- | --- | --- | --- | --- | --- | --- | --- | --- |
|  | [at. %] | [Ω/□] | $T_{S+F}$ (%) | $T_F$ (%) | $T_{S+F}$ (%) | $T_F$ (%) | $T_{S+F}$ (%) | $T_F$ (%) |
| Embodiment 18 | 48 | 15.32 | 83.0 | 89.4 | 47.2 | 51.0 | 29.8 | 32.2 |
| Embodiment 19 | 62 | 16.30 | 83.1 | 89.5 | 54.1 | 58.4 | 34.6 | 37.4 |
| Embodiment 20 | 80 | 16.01 | 82.2 | 88.6 | 62.1 | 67.1 | 41.2 | 44.5 |
| Embodiment 21 | 90 | 17.50 | 82.1 | 88.5 | 72.3 | 78.1 | 56.5 | 61.0 |
| Embodiment 22 | 98 | 15.20 | 84.5 | 91.1 | 75.1 | 81.1 | 62.1 | 67.1 |
| Embodiment 23 | 100 | 18.62 | 85.2 | 91.8 | 78.0 | 84.2 | 65.0 | 70.2 |

In the transparent conductive film in each of Embodiments 18-23, the average transmittance in the visible region (480-800 nm) relative to the film itself is 85% or more and even the average transmittance in the visible region (480-800 nm) relative to the film with the substrate is 80% or more. It is thus confirmed that transparency in the visible region is excellent. Variations in the surface resistance value and the transmittance of light of the film with the substrate and of the film itself, at wavelengths of 380 nm, 320 nm, and 300 nm of the transparent conductive film 1 in Embodiments 18-23 are shown in Table 4. As seen from Table 4, the transparent conductive film of each of Embodiments 18-23 exhibits an extremely high electrical conductivity that the surface resistance is 15-19Ω/□, and preserves the transmission characteristic of light that the transmittance of light of wavelength 380 nm relative to the film itself is as high as more than 88%. The transmittance of light of wavelength 380 nm relative to the film with the substrate is as high as more than 82%. Thus, the transparent conductive film and the transparent conductive base material of low resistance values which have the high conductivity and the high transmittance in a wavelength region of 380-800 nm can be realized.

In Table 4, the transmittances of light at wavelengths of 320 nm and 300 nm are also shown, and it is seen that as the Ga content of the amorphous transparent oxide thin film increases, the transmittance is improved. In particular, when the Ga content is more than 80%, the transparent conductive base material in which the transmittance of light of wavelength 320 nm relative to the film itself is more than 67% and that relative to the film with the substrate is more than 62% can be realized. When the Ga content is more than 90%, the transparent conductive base material that the transmittance of light of wavelength 300 nm relative to the film itself is 61% or Embodiment 24

The transparent conductive film having the structure of each of Embodiments 1-23 is fabricated on entirely the same condition with the exception that the technique of depositing each of the metallic thin film and the transparent conductive film is changed from the sputtering technique to the electron-beam vacuum evaporation technique. The raw material used when each of the metallic thin film and the transparent conductive film is fabricated by the electron-beam vacuum evaporation technique, namely an evaporation tablet, has the same composition and structure as the sputtering target used in each of Embodiments 1-23. By the composition analysis according to the ICP optical emission analysis technique relative to the film and the tablet, it is confirmed that the composition of each film obtained by the electron-beam vacuum evaporation technique is nearly the same as that of the evaporation tablet.

In the transparent conductive film, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

In the transparent conductive film obtained, it is confirmed that the conductivity, the transmission characteristic of light in the visible region (480-800 nm), and the transmission characteristics of light at wavelengths of 380, 320, and 300 nm are nearly equivalent to the case where the film is fabricated by the sputtering technique, and the film is useful as the transparent electrode of the device utilizing the blue or near-ultraviolet LED, the laser, or the organic or inorganic EL element.

Comparative Example 1

The ITO thin film is fabricated on a synthetic quartz glass substrate by the sputtering technique. An ITO sintered body target (an $In_2O_3$ sintered body containing 10 wt. % $SnO_2$) is used and the film is deposited by adjusting the time so that a preset film thickness is reached, at a making power of DC 200 W under the conditions of a gas pressure of 0.5 Pa with a gas mixture of argon and oxygen and a proportion of an oxygen flow rate of 0-5.0%. The substrate, as in the above embodiments, is not heated during film deposition, and the ITO thin film with a thickness of 200 nm is fabricated.

Although the surface resistance of the ITO thin film obtained depends on the proportion of the oxygen flow rate on deposition, the lowest surface resistance of the ITO thin film is 46Ω/□. In this case, the average transmittance in the visible region (480-800 nm) is 82.5% in the film with the substrate and the average transmittance of the film itself is 88.5%.

The transmittance of light of wavelength 380 nm in the film itself is 51.5% and that in the film with the substrate is 47.8%. The transmittances of light with wavelengths of 320 and 300 nm in film itself are 5.0 and 0%, respectively, and the ITO thin film, unlike the transparent conductive film of the present invention in Embodiments 1-24, is almost entirely opaque to light. Thus, such a transparent conductive film or a transparent conductive base material cannot be used as the transparent electrode of the device utilizing the blue or near-ultraviolet LED, the laser, or the organic or inorganic EL element.

Comparative Example 2

Where the transparent conductive film 1 having the structure of FIG. 1 is fabricated, the thickness of the metallic thin film 11 is set to 22 nm. Each of the transparent oxide thin films 10 and 12 is formed as the amorphous oxide thin film composed of gallium, indium, and oxygen and its composition is set to have a gallium content of 50 at. % with respect to all metallic atoms. The metallic thin film 11 is formed as the silver-based alloy thin film 11 in which gold is added to silver, and the added-gold content is set to 2.5 at. %. Also, the synthetic quartz glass substrate is used for the substrate 30.

In the transparent conductive film, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

When the metallic thin film is increased to as thick as 22 nm, the transparent conductive film obtained exhibits a high conductivity that the surface resistance is less than 3Ω/□, but the average transmittance of light of the film itself in the visible region (480-800 nm) is as low as 68% (73.0% in the film with the substrate). Furthermore, the transmittance of light of wavelength 380 nm in the film itself is below 71.1% and that in the film with the substrate is below 66%, which is unfavorable. The transmittance of light with wavelengths of 320 and 300 nm in the film itself is also below 53%. This tendency is the same even when the gallium content of the transparent oxide film is changed in the range of 35-100 at. %. Hence, such a transparent conductive film cannot be used as the transparent electrode of the device utilizing the blue LED, the laser, or the organic or inorganic EL element.

Comparative Example 3

Where the transparent conductive film 1 having the structure of FIG. 1 is fabricated, each of the transparent oxide thin films 10 and 12 is formed as the amorphous oxide thin film composed of gallium, indium, and oxygen and its composition is set to have a gallium content of 30 at. % with respect to all metallic atoms. The metallic thin film 11 is formed as the silver-based alloy thin film 11 in which gold is added to silver, and the added-gold content is set to 2.5 at. %. Also, the 7059 glass substrate is used for the substrate 30, and the film thickness of each layer is set to be the same as in Embodiments 1-7. In the transparent conductive film, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

The surface resistance value of the transparent conductive film 1 and the transmittance of light of wavelength 380 nm are shown in Table 5.

TABLE 5

| | Gallium content of transparent oxide thin film | Gold content of silver-based alloy thin film | Copper content of silver-based alloy thin film | Surface resistance value of transparent conductive film | Transmittance of light (wavelength 380 nm) | |
|---|---|---|---|---|---|---|
| | [at. %] | [at. %] | [at. %] | [Ω/□] | $T_{S+F}$ (%) | $T_F$ (%) |
| Comparative example 3 | 30 | 2.5 | — | 5.11 | 69.7 | 77.2 |

When the gallium content of each of the transparent oxide thin films 10 and 12 is reduced to 30 at. %, the film exhibits a high conductivity that the surface resistance is less than 10Ω/□, and the average transmittance of light of the film itself in the visible region (480-800 nm) becomes more than 80%. However, the transmittance of light of wavelength 380 nm in the film itself is below 80% and that in the film with the substrate is below 70%, which is unfavorable. Hence, such a transparent conductive film or a transparent conductive base material cannot be used as the transparent electrode of the device utilizing the blue LED, the laser, or the organic or inorganic EL element.

Comparative Examples 4-7

In the transparent conductive film having the structure of FIG. 1, the transparent conductive film is fabricated on the same condition as in Embodiments 1-7 with the exception that each of the transparent oxide thin films 10 and 12 is formed as the amorphous oxide thin film composed of indium, cerium, and oxygen (In—Ce—O, the ICO film) and its composition is set to have a cerium content ({Ce/(Ce+In)}×100(%)) of 11.3 at. % with respect to all metallic atoms. The metallic thin film 11 is formed as the silver-based alloy thin film 11 in which gold is added to silver, four kinds of added-gold contents of 0.1, 1.0, 2.5, and 4.0 at. % are provided, and the film thickness is set to 10 nm. Variations in the surface resistance value and the transmittance of light of wavelength 380 nm of the transparent conductive film 1 fabricated on the 7059 glass substrate are shown in Table 6. Any film of individual layers is deposited by the sputtering technique of the conditions described in Embodiments 1-7.

TABLE 6

| | Cerium content of transparent oxide thin film | Gold content of silver-based alloy thin film | Copper content of silver-based alloy thin film | Surface resistance value of transparent conductive film | Transmittance of light (wavelength 380 nm) | |
| --- | --- | --- | --- | --- | --- | --- |
| | [at. %] | [at. %] | [at. %] | [Ω/□] | $T_{S+F}$ (%) | $T_F$ (%) |
| Comparative example 4 | 11.3 | 0.1 | — | 5.07 | 51.2 | 56.7 |
| Comparative example 5 | 11.3 | 1.0 | — | 5.12 | 51.0 | 56.5 |
| Comparative example 6 | 11.3 | 2.5 | — | 5.92 | 51.4 | 56.9 |
| Comparative example 7 | 11.3 | 4.0 | — | 6.43 | 49.2 | 54.5 |

When each of the transparent oxide thin films 10 and 12 is formed as the amorphous oxide thin film composed of indium, cerium, and oxygen, the surface resistance becomes less than 10Ω/□. However, the transmittance of light of wavelength 380 nm in the film itself is much lower than 80% and is as low as about 57%, which is unfavorable. Hence, such a transparent conductive film cannot be used as the transparent electrode of the device utilizing the blue LED, the laser, or the organic or inorganic EL element.

tents of 0.1, 1.0, 2.5 and 4.0 at. % are provided, and the film thickness is set to 7-8 nm. The synthetic quartz glass substrate is used for the substrate 30, and the transparent conductive film is formed on the substrate by the sputtering technique of the same condition as in Embodiments 12-17. Characteristics of the transparent conductive film 1 obtained are shown in Table 7. These comparative examples exhibit the same tendency as Comparative examples 4-7, and the surface resistance is less than 15Ω/□. Although the transmittance of light in the visible region is high, the transmittance of light of wavelength 380 nm in the film itself is less than 47% and that in the film with the substrate is less than 44%, which are extremely low. Moreover, the transmittance of light of wavelength 320 or 300 nm, as shown in Table 7, is much lower than in the Embodiments of the present invention. Thus, such a transparent conductive film cannot be used as the transparent electrode of the device utilizing the blue or near-ultraviolet LED, the laser, or the organic or inorganic EL element.

TABLE 7

| | Tin content of transparent oxide thin film | Gold content of silver-based alloy thin film | Copper content of silver-based alloy thin film | Surface resistance value of transparent conductive film | Transmittance of light (wavelength 380 nm) | | Transmittance of light (wavelength 320 nm) | | Transmittance of light (wavelength 300 nm) | |
| --- | --- | --- | --- | --- | --- | --- | --- | --- | --- | --- |
| | [at. %] | [at. %] | [at. %] | [Ω/□] | $T_{S+F}$ (%) | $T_F$ (%) | $T_{S+F}$ (%) | $T_F$ (%) | $T_{S+F}$ (%) | $T_F$ (%) |
| Comparative example 8 | 7.5 | 0.1 | — | 11.32 | 43.5 | 46.9 | 15.1 | 16.3 | 9.3 | 10.0 |
| Comparative example 9 | 7.5 | 1.0 | — | 12.35 | 43.2 | 46.6 | 15.6 | 16.8 | 9.2 | 9.9 |
| Comparative example 10 | 7.5 | 2.5 | — | 14.20 | 43.1 | 46.4 | 14.9 | 16.1 | 9.0 | 9.7 |
| Comparative example 11 | 7.5 | 4.0 | — | 13.50 | 42.9 | 46.2 | 14.6 | 15.8 | 8.9 | 9.6 |

Comparative Examples 8-11

In the transparent conductive film 1 having the structure of FIG. 1, each of the transparent oxide thin films 10 and 12 is formed as the amorphous oxide thin film composed of indium, tin, and oxygen (In—Sn—O, the ITO film), its composition is set to have a tin content ({Sn/(Sn+In)}×100(%)) of 7.5 at. % with respect to all metallic atoms, and individual film thicknesses are set in the range of 38-44 nm. The metallic thin film 11 is formed as the silver-based alloy thin film 11 in which gold is added to silver, four kinds of added-gold con- Comparative Example 12

The transparent conductive film is fabricated on the same deposition condition as in Embodiment 18 with the exception that the transparent oxide thin film 10 in the transparent conductive film 1 having the structure of FIG. 4 is formed as the amorphous oxide thin film composed of indium, tin, and oxygen (In—Sn—O, the ITO film) and its composition is set to have a tin content ({Sn/(Sn+In)}×100(%)) of 7.5 at. % with respect to all metallic atoms. The synthetic quartz glass substrate is used for the substrate 30. The surface resistance of the transparent conductive film fabricated is 15.09Ω/□.

Although the transmittance of light in the visible region relative to the film itself is as high as more than 80%, the transmittance of light of wavelength 380 nm in the film itself is 43.2% and that in the film with the substrate is 40.1%. Moreover, the transmittances of light of wavelengths 320 and 300 nm in the film itself are 13.2 and 6.0%, which are much lower than in the transparent conductive film of each of Embodiments 1-24 of the present invention. Thus, such a transparent conductive film cannot be used as the transparent electrode of the device utilizing the blue or near-ultraviolet LED, the laser, or the organic or inorganic EL element.

Comparative Example 13

The transparent conductive film having the structure of FIG. 1 is fabricated by adopting the same method (a take-up sputtering technique) and fabrication condition as in Embodiment 11 with the exception that the thickness of the metallic thin film 11 in the transparent conductive film of the Embodiment 11 is changed to 0.8 nm, and also by using the same composition as Embodiment 11.

In Table 8, characteristics of the transparent conductive film obtained are shown.

TABLE 8

| | Gallium content of transparent oxide thin film | Kind/thickness of metallic thin film | Surface resistance value of transparent conductive film | Transmittance of light (wavelength 380 nm) | |
| --- | --- | --- | --- | --- | --- |
| | [at. %] | [at. %] | [Ω/□] | $T_{S+F}$ (%) | $T_F$ (%) |
| Comparative example 13 | 50 | 2.5 at. % gold-added silver thin film/0.8 nm | Immeasurable | 86.2 | 97.3 |

When the thickness of the silver-based alloy thin film 11 is set to 0.8 nm, the transmittance of light of wavelength 380 nm in the film itself is more than 80%, but the surface resistance value is immeasurable and the conductivity is not exhibited. Hence, such a film cannot be used as the electrode.

Comparative Example 14

As Comparative example 14, the transparent oxide film having the structure of FIG. 1 is fabricated to use the amorphous oxide thin film composed of gallium, indium, and oxygen and containing 32 at. % gallium. Each of the transparent oxide thin films 10 and 12 is formed as the amorphous oxide thin film composed of gallium, indium, and oxygen so that its composition is built up by a gallium content of 32 at. % with respect to all metallic atoms, and the thickness of each transparent oxide thin film is set to 40 nm. The metallic thin film 11 is formed as the silver-based alloy thin film in which silver contains 2.5 at. % gold and its thickness is set to 7 nm. The synthetic quartz glass substrate is used for the substrate 30, and the film is fabricated on the same condition as in the Embodiments 12-17 by the sputtering technique.

In the transparent conductive film, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

The surface resistance value and the transmittances of light with wavelengths of 380, 320, and 300 nm in the transparent conductive film 1 are shown in Table 9.

TABLE 9

| | Gallium content of transparent oxide thin film | Gold content of silver-based alloy thin film | Copper content of silver-based alloy thin film | Surface resistance value of transparent conductive film | Transmittance of light (wavelength 380 nm) | | Transmittance of light (wavelength 320 nm) | | Transmittance of light (wavelength 300 nm) | |
|---|---|---|---|---|---|---|---|---|---|---|
| | [at. %] | [at. %] | [at. %] | [Ω/□] | $T_{S+F}$ (%) | $T_F$ (%) | $T_{S+F}$ (%) | $T_F$ (%) | $T_{S+F}$ (%) | $T_F$ (%) |
| Comparative example 14 | 32 | 2.5 | — | 11.23 | 69.8 | 75.2 | 29.4 | 31.8 | 20.8 | 22.5 |

When the gallium content of each of the transparent oxide thin films 10 and 12 is reduced to 30 at. %, the film exhibits a high conductivity that the surface resistance is 11.3Ω/□, and the average transmittance of light of the film itself in the visible region becomes more than 80%. However, the transmittance of light of wavelength 380 nm of the film itself is below 80% and that of the film with the substrate is below 70%, which is unfavorable. Moreover, the transmittances of light with wavelengths of 320 and 300 nm are considerably impaired, compared with those of the embodiments in the present invention. Hence, such a transparent conductive film cannot be used as the transparent electrode of the device utilizing the blue or near-ultraviolet LED, the laser, or the organic or inorganic EL element.

Comparative Example 15

As Comparative example 15, the fabrication of the transparent oxide film having the structure of FIG. 1 for which the ICO film is used is carried out. Each of the transparent oxide thin films 10 and 12 is formed as the amorphous oxide thin film composed of indium, cerium, and oxygen (ICO) so that its composition is built up to have a cerium content of 11.3 at. % with respect to all metallic atoms, and the thickness of each transparent oxide thin film is set to 41 nm. The metallic thin film 11 is formed as the silver-based alloy thin film 11 that contains 1 at. % gold and 0.5 at. % copper and its thickness is set to 7 nm. The synthetic quartz glass substrate is used for the substrate 30, and the film is fabricated on the same condition as in Embodiments 12-17 by the sputtering technique.

In the transparent conductive film, a sectional sample is produced by the FIB processing, and from the observation of a sectional structure under the transmission electron microscope (TEM), it is confirmed that film thicknesses of individual layers of the transparent oxide thin film and the silver-based alloy thin film are retained according to the design. Further, from measurements by the electron diffractograph attached to the TEM, it is confirmed that the transparent oxide thin film has the amorphous structure.

The surface resistance value and the transmittances of light with wavelengths of 380, 320, and 300 nm in the transparent conductive film 1 are shown in Table 10.

The amorphous oxide thin film composed of indium, cerium, and oxygen is used for each of the transparent oxide

TABLE 10

| | Gallium content of transparent oxide thin film | Gold content of silver-based alloy thin film | Copper content of silver-based alloy thin film | Surface resistance value of transparent conductive film | Transmittance of light (wavelength 380 nm) | | Transmittance of light (wavelength 320 nm) | | Transmittance of light (wavelength 300 nm) | |
|---|---|---|---|---|---|---|---|---|---|---|
| | [at. %] | [at. %] | [at. %] | [Ω/□] | $T_{S+F}$ (%) | $T_F$ (%) | $T_{S+F}$ (%) | $T_F$ (%) | $T_{S+F}$ (%) | $T_F$ (%) |
| Comparative example 15 | 11.3 | 1.0 | 0.5 | 13.65 | 53.1 | 57.2 | 13.5 | 14.6 | 9.2 | 9.9 | thin films 10 and 12. The transparent conductive film 1 in which the silver alloy thin film containing gold and copper is used for the metallic thin film 11 exhibits a high conductivity that the surface resistance is 13.65Ω/□, and the average transmittance of light of the film itself in the visible region becomes more than 80%. However, the transmittance of light of wavelength 380 nm of the film itself is below 55% and that of the film with the substrate is below 60%, which is unfavorable. Moreover, the transmittances of light with wavelengths of 320 and 300 nm are considerably impaired, compared with those of the embodiments in the present invention. Hence, such a transparent conductive film cannot be used as the transparent electrode of the device utilizing the blue or near-ultraviolet LED, the laser, or the organic or inorganic EL element.

Embodiment 25, Comparative Example 16

The transparent conductive film of the present invention is used as the electrode to experimentally fabricate a double-heterostructure near-ultraviolet LED element that an InGaN active layer is sandwiched between AlGaN clad layers.

On the surface of a GaN substrate, an n-GaN:Si contact layer (4 μm), an n-$Al_{0.1}Ga_{0.9}$N:Si clad layer (30 nm), an undoped InGaN active layer (5 nm), a p-$Al_{0.15}Ga_{0.85}$N:Mg clad layer (60 nm), and a p-GaN:Mg contact layer (120 nm) are successively formed. In a lamination element obtained in this way, a lamination film of Ni (2 nm)/Au (3 nm) is formed as an n electrode on the back side of the GaN substrate so that an Ni film is disposed on the GaN substrate side. Subsequently, a transparent electrode is formed as a p electrode on the surface of the p-GaN:Mg contact layer to experimentally fabricate the near-ultraviolet LED element.

In the near-ultraviolet LED element described above, when the transparent conductive film of each of Embodiments 18-23 in the present invention is used for the transparent electrode (Embodiment 25), a luminous output at a wavelength of 371 nm where light is emitted on the same condition is 20% higher than in the case where the transparent conductive film of Comparative example 12 is used (Comparative example 16).

The invention claimed is:

1. A transparent conductive film having a lamination structure having a surface of a metallic thin film coated with a transparent oxide thin film, wherein the transparent oxide thin film is an amorphous oxide thin film consisting of gallium, indium, and oxygen, and a gallium content of the transparent oxide thin film is at least 62 at. % with respect to all metallic atoms, wherein the metallic thin film is constructed with a single layer having at least one, as a main component, selected from the group consisting of silver, gold, platinum, palladium, rhodium, iridium, ruthenium, osmium, nickel, copper, and aluminum, or the metallic thin film is constructed with a laminated layer of at least two kinds of single-layer films having different compositions, wherein the metallic thin film ranges in thickness from 1 nm to 20 nm, and wherein the transmittance of light with a wavelength of 380 nm in the transparent conductive film is 88.5% or more, the transmittance of light with a wavelength of 320 nm in the transparent conductive film is 58.4% or more, and the transmittance of light with a wavelength of 300 nm in the transparent conductive film is 37.4% or more, respectively.

2. A transparent conductive film having a three-layer structure having a metallic thin film sandwiched between transparent oxide thin films, wherein each of the transparent oxide thin films is an amorphous oxide thin film consisting of gallium, indium, and oxygen, and a gallium content of each transparent oxide thin film is at least 62 at. % with respect to all metallic atoms, wherein the metallic thin film is constructed with a single layer having at least one, as a main component, selected from the group consisting of silver, gold, platinum, palladium, rhodium, iridium, ruthenium, osmium, nickel, copper, and aluminum, or the metallic thin film is constructed with a laminated layer of at least two kinds of single-layer films having different compositions, wherein the metallic thin film ranges in thickness from 1 nm to 20 nm, and wherein the transmittance of light with a wavelength of 380 nm in the transparent conductive film is 92.3% or more, the transmittance of light with a wavelength of 320 nm in the transparent conductive film is 62.3% or more, and the transmittance of light with a wavelength of 300 nm in the transparent conductive film is 41.1% or more, respectively.

3. A transparent conductive film according to claim 1 or 2, wherein the metallic thin film is a silver alloy that contains silver as a main component and has a gold content ranging from 0.1 at. % to 4.0 at. %.

4. A transparent conductive film according to claim 1 or 2, wherein the metallic thin film is a silver alloy that contains silver as a main component and has a gold content ranging from 0.1 at. % to 2.5 at. % and a copper content ranging from 0.1 at. % to 1.0 at. %.

5. A transparent conductive film according to claim 1 or 2, wherein the metallic thin film is a lamination film of nickel and gold.

6. A transparent conductive film according to claim 1 or 2, wherein the metallic thin film ranges in thickness from 5 nm to 20 nm.

7. A transparent conductive film according to claim 2, wherein the metallic thin film ranges in thickness from 1 nm to 20 nm and contains one selected from the group consisting of silver, gold, platinum, palladium, rhodium, iridium, ruthenium, and osmium, a content of a selected metallic element being 96 at. % or more.

8. A transparent conductive film according to claim 7, wherein the metallic thin film is a silver alloy that has a gold content ranging from 0.1 at. % to 4.0 at. %.

9. A transparent conductive film according to claim 7, wherein the metallic thin film is a silver alloy that has a gold content ranging from 0.1 at. % to 2.5 at. % and a copper content ranging from 0.1 at. % to 1.0 at. %.

10. A transparent conductive film according to claim 1 or 2, wherein a surface resistance is less than $20\Omega/\square$.

11. A transparent conductive base material comprising a transparent conductive film according to claim 1 or 2, formed on one or each surface of a transparent substrate of one selected from the group consisting of a glass plate, a quartz plate, a resin plate or resin film, one or each surface of which is coated with a gas barrier film, and resin plates or resin films between which the gas barrier film exists.

12. A transparent conductive base material according to claim 11, wherein the gas barrier film is at least one selected from the group consisting of a silicon oxide film, a silicon oxide-nitride film, a magnesium aluminate film, a tin oxide-based film, and a diamond-like carbon film.

13. A transparent conductive base material according to claim 11, wherein the resin plate or the resin film is formed of polyethylene terephthalate (PET), polyether sulfone (PES), polyarylate (PAR), polycarbonate (PC), or polyethylene naphthalate (PEN), or has a lamination structure that a surface of such a substance is coated with acrylic-based organic matter.

14. A transparent conductive base material according to claim 11, wherein a surface resistance is less than $20\Omega/\square$.

15. A light-emitting device in which a transparent conductive film according to claim 1 or 2 is used for a transparent electrode.

\* \* \* \* \*